United States Patent [19]

Sakaue et al.

[11] 4,249,145
[45] Feb. 3, 1981

[54] INPUT-WEIGHTED CHARGE TRANSFER TRANSVERSAL FILTER

[75] Inventors: Tatsuo Sakaue, Yokohama; Yasoji Suzuki, Ayase; Tetsuya Iida, Yokohama, all of Japan

[73] Assignee: Tokyo Shibaura Denki Kabushiki Kaisha, Japan

[21] Appl. No.: 63,564

[22] Filed: Aug. 3, 1979

[30] Foreign Application Priority Data

Aug. 17, 1978 [JP] Japan .................................. 53-100408
Aug. 17, 1978 [JP] Japan .................................. 53-100413

[51] Int. Cl.³ .................... H03H 15/02; G11C 27/02; H03K 17/693
[52] U.S. Cl. ............................ 333/165; 307/221 D; 333/166; 357/24
[58] Field of Search ........................ 333/165, 166; 307/221 R, 221 C, 221 D, 304, 295; 357/24; 364/821, 862

[56] References Cited

U.S. PATENT DOCUMENTS

| 3,819,954 | 6/1974 | Butler et al. ............... 307/221 D |
| 4,035,628 | 7/1977 | Lampe et al. .............. 333/165 X |
| 4,080,581 | 3/1978 | Sakaue et al. ............... 333/165 |
| 4,163,957 | 8/1979 | Knauer et al. ............... 333/165 |
| 4,188,597 | 2/1980 | Knauer ....................... 333/165 |

OTHER PUBLICATIONS

Sakaue et al.-"An Input Weighted CCD Transversal Filter" (Reprint) Japanese Journal of Applied Physics, vol. 16 (1977) Supplement 16-1; pp. 391-396.

Primary Examiner—Marvin L. Nussbaum
Attorney, Agent, or Firm—Finnegan, Henderson, Farabow, Garrett & Dunner

[57] ABSTRACT

An input-weighted charge transfer transversal filter which comprises a charge transfer device including a plurality of stages, a plurality of signal charge injectors to inject into the stages of the charge transfer device weighted signal charge packets containing an AC component and a DC component, and a sense amplifier to sense the output signal of the transversal filter from the final stage of the charge transfer device, a DC charge injector to inject a predetermined quantity of DC charge into the first stage of the charge transfer device, and charge drains respectively coupled to the stages of the charge transfer device to drain at least DC charge from stages. Due to this arrangement the quantity of DC component injected by the signal charge injectors and transferred through the charge transfer device will be reduced. This leads to an improvement in packing density and signal detecting capability of the transversal filter. According to a first embodiment of this invention, positive weighting of a signal is achieved by injecting a weighted signal charge packet into the stage of the charge transfer device, while negative weighting is achieved by draining the weighted signal charge packet from the stage. According to a second embodiment, selection between positive and negative weighting depends on the polarity of an input signal applied to the signal charge injector.

15 Claims, 24 Drawing Figures

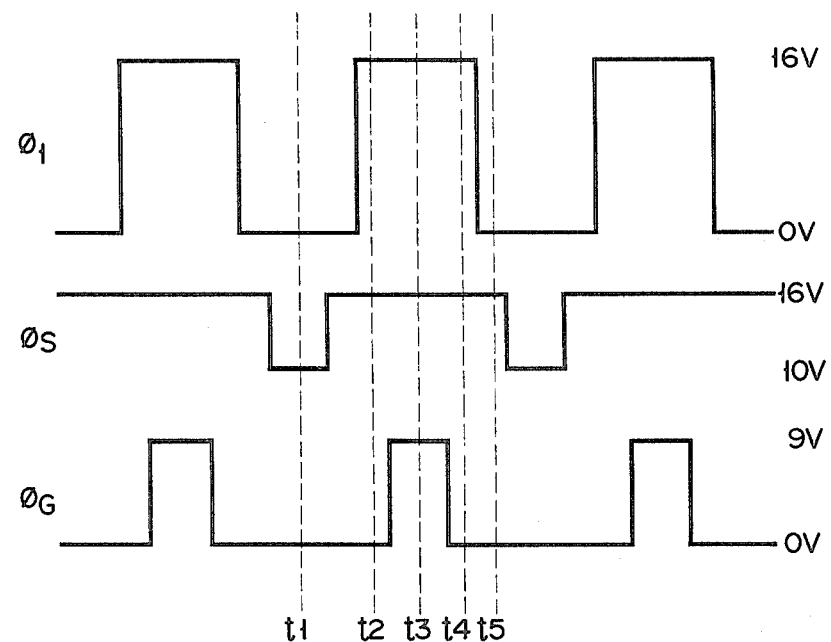

$t=t_1$ $t=t_2$ $t=t_3$ $t=t_4$ $t=t_5$ $t=t_1$ $t=t_2$ $t=t_3$ $t=t_4$ $t=t_5$

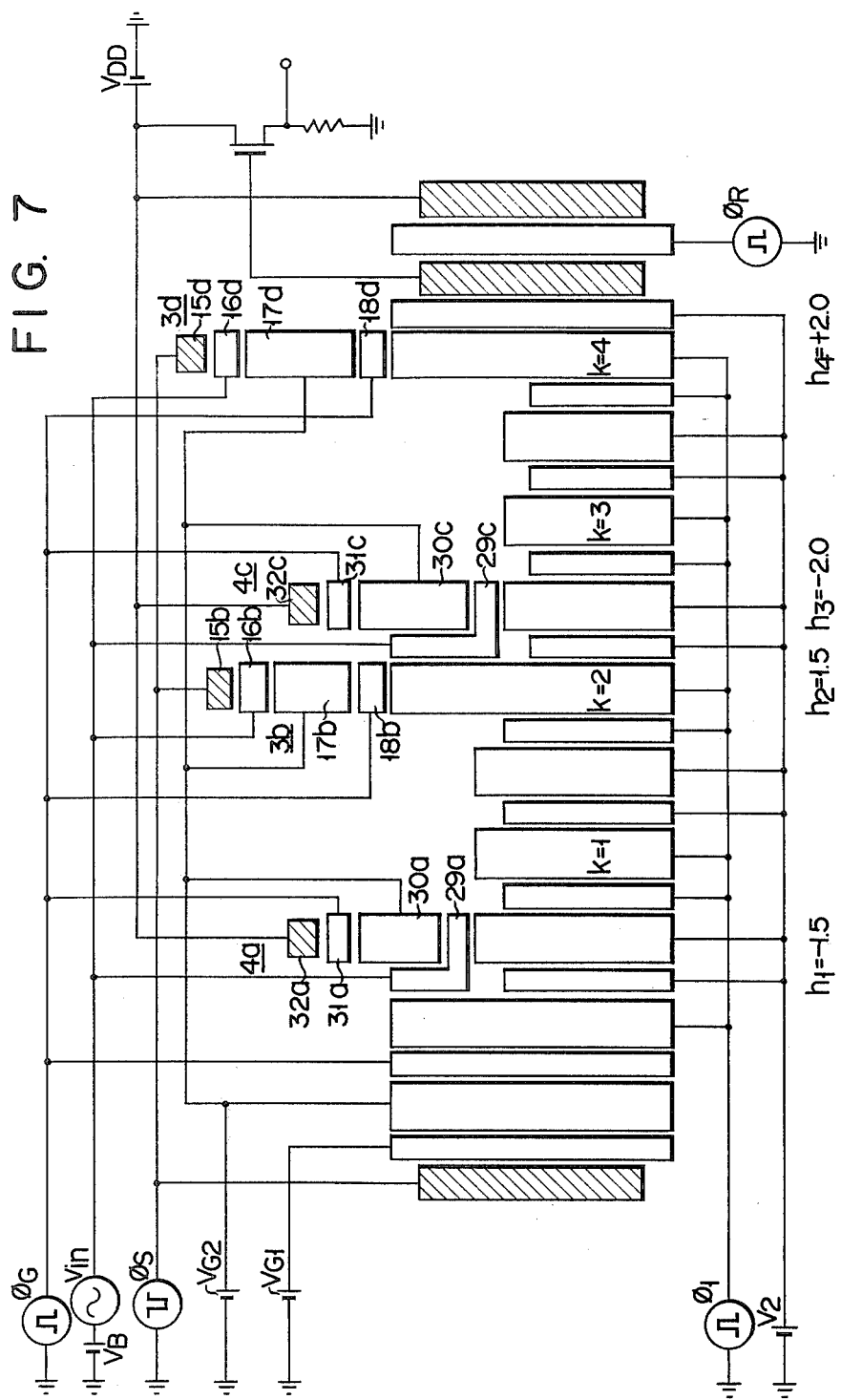

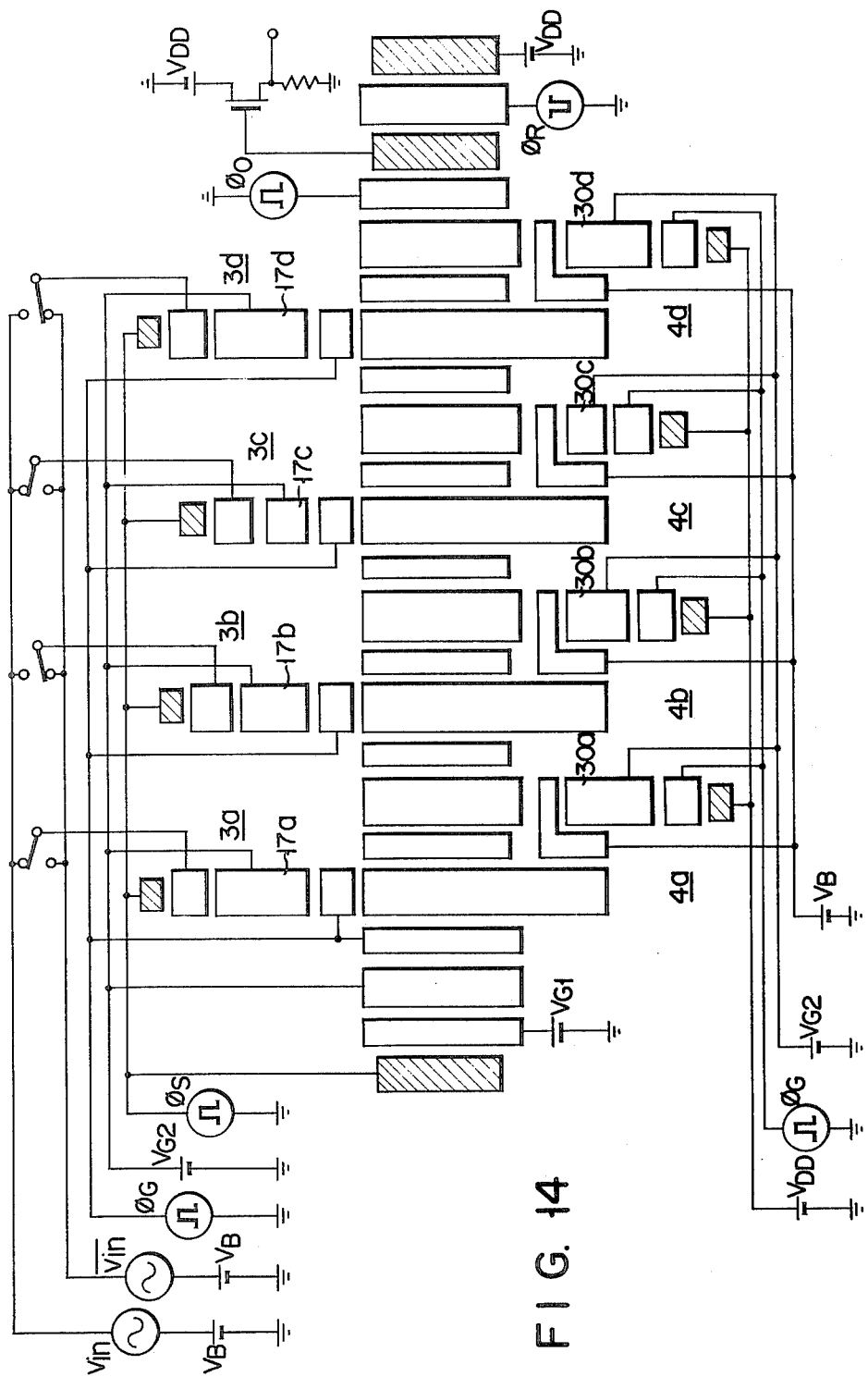
F I G. 14

INPUT-WEIGHTED CHARGE TRANSFER TRANSVERSAL FILTER

This invention relates to an input-weighted charge transfer transversal filter and, more particularly, to an input-weighted charge transfer transversal filter capable of cancelling DC charge injected into a charge transfer device along with weighted-input signal charge packets, and optional positive and negative weighting of signal.

As is well known, a charge transfer device (CTD), such as a charge-coupled device (CCD) and bucket brigade device (BBD), may be applied to a transversal filter owing to its time delay function. Recently there has been developed an input-weighted CTD transversal filter with high packing density and satisfactory frequency response. In the input-weighted CTD transversal filter, as stated in the specification of U.S. Pat. No. 4,080,581, an analog input signal is branched off, and each branched signal is multiplied by a weighting coefficient. Each product obtained is sampled in each stage of the charge transfer device, and the sampled signal is added to a delayed signal from the preceding stage. In such a transversal filter, a DC charge corresponding to the DC component of the input signal is introduced into a charge transfer device together with a weighted input signal charge packet. Consequently, the quantity of DC charge transferred from the first stage of the charge transfer device to the final stage thereof increases gradually. Thus, the input-weighted CTD transversal filter has a disadvantage that the areas of transfer electrodes for each stage must be increased from the first stage toward the final stage. Moreover, the increase of the DC charge would reduce the signal detecting capability at an output means. Furthermore, the polarity of charge carriers in CTD is essentially unidirectional, so that prior art CTD transversal filters could achieve positive and negative weighting of signal simultaneously only by using circuit means which would bring about an increase in circuit scale.

A first object of this invention is to provide a charge transfer transversal filter conducive to improvement in packing density and signal detecting capability.

A second object of the invention is to provide a CTD transversal filter capable of optional positive and negative weighting of a signal.

The first object may be attained by providing an input-weighted transversal filter, which comprises a charge transfer device including a plurality of stages, signal charge injectors to inject into the stages of the charge transfer device weighted signal charge packets containing an AC component and a DC component, output means for detecting the output charge of the charge transfer device, with a DC charge injector to inject a predetermined quantity of DC charge into the first stage of the charge transfer device, and a plurality of charge drains coupled to the stages of the charge transfer device to drain at least DC component from their corresponding stages.

The second object may be attained by draining for negative weighting also an AC signal charge packet by means of the charge drains.

This invention can be more fully understood from the following detailed description when taken in conjunction with the accompanying drawings, in which:

FIG. 4 is a timing diagram of pulses used in the arrangement of FIG. 3;

FIGS. 7 and 8 show alternative transversal filters according to the teachings of FIG. 1;

FIGS. 13 and 14 show alternative transversal filter according to the teaching of FIG. 10.

Figure 1:
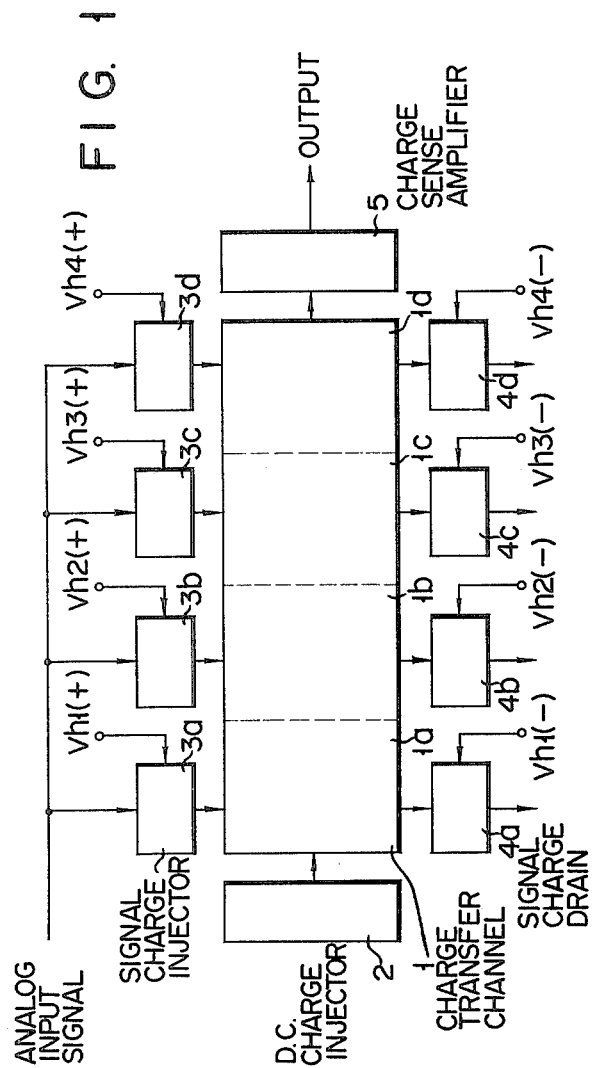
FIG. 1 is a block diagram of a programmable input-weighted transversal filter according to an embodiment of this invention.

Referring now to FIG. 1 showing a schematic block diagram of a programmable input-weighted CTD transversal filter according to an embodiment of this invention, a charge transfer channel or CCD 1 includes a plurality of stages-four stages $1a$ to $1d$ by way of example. A DC charge corresponding to a virtual zero level is injected into the first stage $1a$ of the channel 1 by means of a DC charge injector 2. The DC charge is transferred from the first stage $1a$ to the final stage $1d$. Signal charge injectors $3a$ to $3d$ are provided which are coupled to the stages $1a$ to $1d$ of the channel 1, respectively.

An analog input signal is branched-off and each branched input signal is applied to the injectors $3a$ to $3d$, where it is multiplied by weighting coefficients depending on the magnitudes of weighting voltages $Vh1(+)$, $Vh2(+)$, $Vh3(+)$ and $Vh4(+)$. Each of the injectors $3a$ to $3d$ injects into its corresponding stage a weighted signal charge packet corresponding to the product of the branched input signal and the weighting coefficient. In each stage, a weighted signal charge packet from its corresponding signal charge injector and a delayed charge packet from the preceding stage are added together.

Signal charge drains $4a$ to $4d$ are provided which are coupled to the stages $1a$ to $1d$ of the charge transfer channel 1, respectively. These signal charge drains $4a$ to $4d$ drain their corresponding stages of signal charge packets multiplied by weighting coefficients depending on the magnitudes of control voltages $Vh1(-)$, $Vh2(-)$, $Vh3(-)$ and $Vh4(-)$. On the output side of the channel 1 is a charge sense amplifier 5 which detects the output signal charge of the channel 1.

Figure 2:
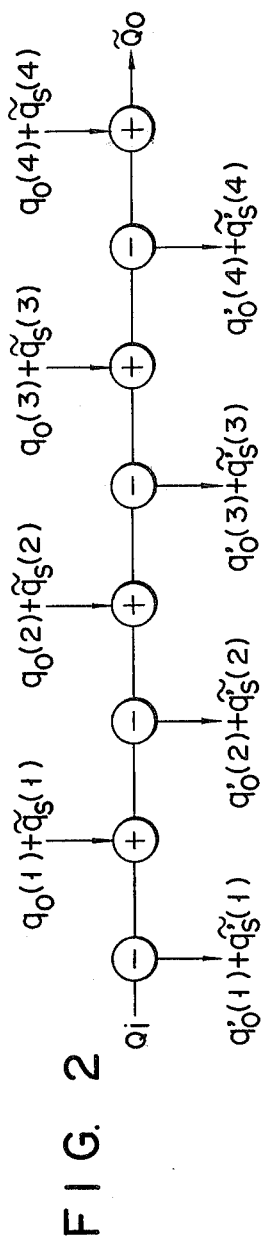
FIG. 2 is a diagram illustrating the operation principle of the transversal filter of FIG. 1.

FIG. 2 is a diagram for illustrating the operation of the transversal filter as shown in FIG. 1. If the DC charge injected into the channel 1 by the DC charge injector 2 is Qi, a weighted input signal charge packet injected into the kth stage of the channel 1 is qo(k) + q̃s(k), and a signal charge packet drained or exhausted from the k'th stage is 1'o(k') + q̃'s(k'), then a charge Q̃o to reach the charge sense amplifier 5 is given by $$\tilde{Q}o = Qi + \sum_{k=1}^{4}\{qo(k)+\tilde{q}s(k)\} - \sum_{k'=1}^{4}\{q'o(k')+\tilde{q}'s(k')\} \quad (1)$$

where qo(k) and q̃s(k) are DC and AC components of the signal charge injected into the kth stage, respectively, while q'o(k') and q̃'s(k') are DC and AC components of the signal charge drained from the k'th stage.

Where qo(k) = q'o(k'), we obtain from eq. (1)

$$Qo = Qi + \sum_{k=1}^{4}\tilde{q}s(k) - \sum_{k'=1}^{4}\tilde{q}'s(k') \quad (2)$$

That is, the output charge Qo equals the injected DC charge Qi plus an AC charge fluctuating positively and negatively with respect to the level of Qi. The widest dynamic range may be provided for the AC components appearing at the output when the quantity of the DC charge Qi injected into the transfer channel 1 is approximately half the maximum quantity of charge that can be stored in each stage of the transfer channel 1.

Where qo(k) ≠ q'o(k+), on the other hand, we obtain from eq. (1)

$$Qo = Qi + \sum_{k=1}^{4}\tilde{q}s(k) - \sum_{k'=1}^{4}\tilde{q}'s(k') + \epsilon \quad (3)$$

$$\text{where } \epsilon = \sum_{k=1}^{4}qo(k) - \sum_{k'=1}^{4}q'o(k').$$

That is, ε is the difference between the sum total of the DC components of the injected signal charge packets and the sum total of the DC components of the drained signal charge. In this case, therefore, the dynamic range of the AC components appearing at the output becomes narrower than the range given by eq. (2).

In the construction as shown in FIG. 1, a signal charge drain corresponding to a stage injected with the signal charge should be cut-off by a weighting voltage lest the signal charge be drained from the stage. On the other hand, a signal charge injector for a stage from which the signal charge is drained should be cut-off lest the signal charge be injected into the stage. Namely, this means that K ≠ k' in eqs. (1) to (3). Accordingly, under the condition qo(k) = q'o(k'), a DC component q'o(2) equal to a DC component qo(1) is drained from the second stage 1b when the component qo(1) is injected into the first stage 1a, for example, while a DC component q'o(4) equal to a DC component qo(3) is drained from the fourth stage 1d when the component qo(3) is injected into the third stage 1c.

In the transversal filter of FIG. 1, positive weighting of the signal is achieved by the injection of signal charge into the stage, while negative weighting of the signal is done by draining the stage of the signal charge. Therefore, the weighting voltage Vhk(+) applied to each signal charge injector may have the same polarity as that of the weighting voltage Vhk(−) applied to each signal charge drain. The transversal filter of FIG. 1 may have its frequency response optionally programmed by changing the magnitudes of a weighting voltage externally applied thereto.

Figure 3:
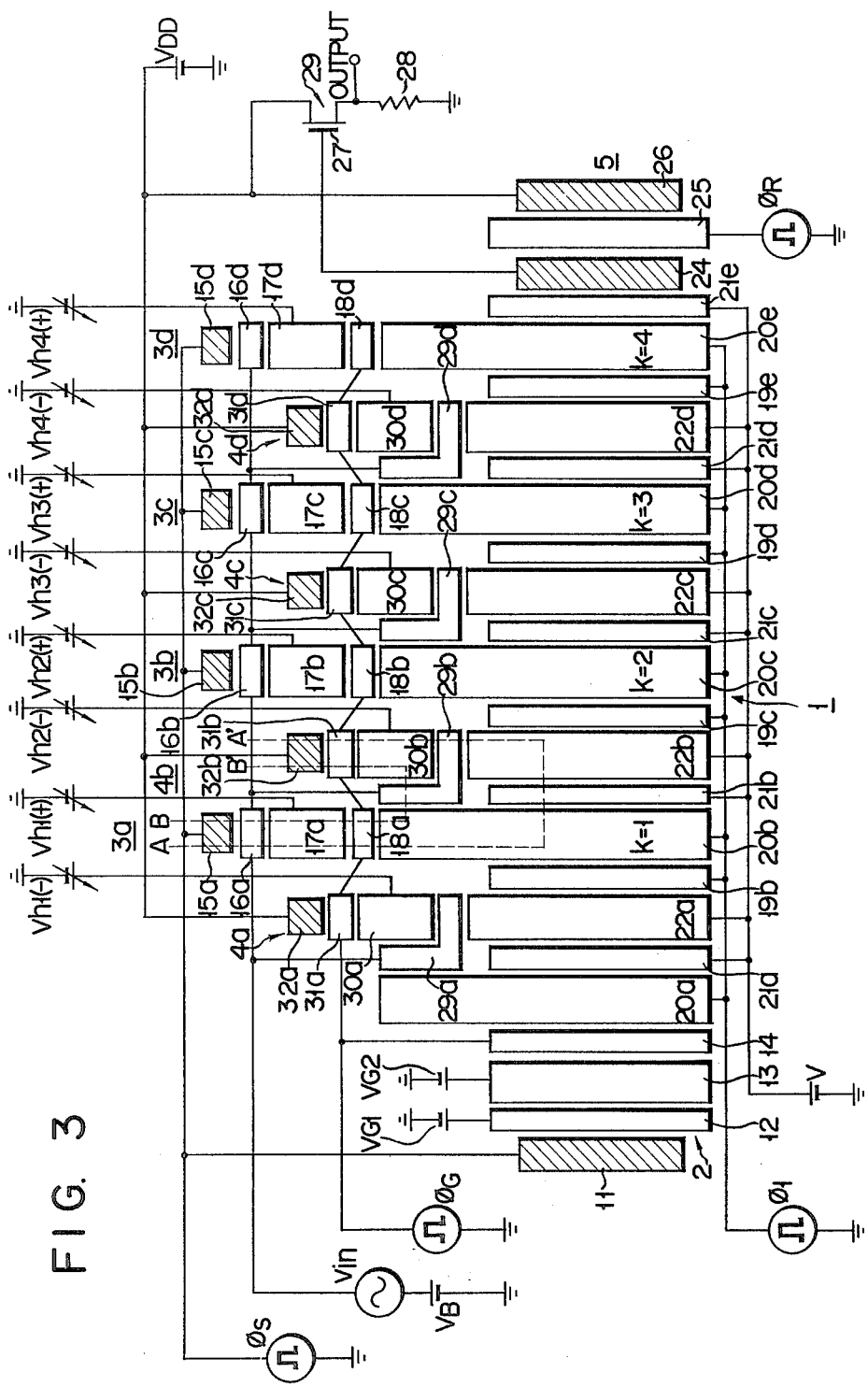
FIG. 3 is a plan view showing a practical arrangement of the transversal filter of FIG. 1.

FIG. 3 shows a practical arrangement of the transversal filter of FIG. 1. The following description will be given by taking the case of a transversal filter fabricated on a P-type silicon substrate by a standard process and using a single-phase driven CCD with a buried channel for charge transfer. The charge injection is made by the potential equilibration method.

In FIG. 3, the DC charge injector means 2 is comprised of a N+-type source region 11 formed in the P-type silicon substrate, and first, second and third gate electrodes 12, 13 and 14 successively arranged on an insulating layer overlaying the substrate adjacent to the source region 11. The first and second gate electrodes 12 and 13 are supplied with predetermined DC bias voltages VG1 (8 V) and VG2 (12 V), respectively, whereby the second gate electrode 13 will be allowed to store thereunder a quantity of charge substantially half the maximum quantity of charge that can be stored in each stage of the transfer channel. The quantity of charge allowed to be stored under the second gate electrode 13 depends on the potential difference between the first and second gate electrodes 12 and 13 as well as the area of the second gate electrode 13. The source region 11 and the third gate electrode 14 are supplied with pulses φ$_S$ (10 to 16 V) and φ$_G$ (0 to 9 V), respectively, so that the transfer of charge from under the second gate electrode 13 to under a transfer electrode 20a of the CCD 1 is prevented while the charge is being injected under the second electrode 13 from the source region 11, whereas the charge is transferred from under the second electrode 13 to under the transfer electrode 20a of the CCD 1 while the injection of charge from the source region 11 is prohibited.

The signal charge injector means 3a, 3b, 3c and 3d inject signal charges into their corresponding stages of the CCD 1, having the same construction, and are comprised of source regions 15a, 15b, 15c and 15d, first gate electrodes 16a, 16b, 16c and 16d, second gate electrodes 17a, 17b, 17c and 17d, and third gate electrodes 18a, 18b, 18c and 18d, respectively. In the buried layer of the semiconductor substrate under the first gate electrodes 16a 16b, 16c and 16d and third gate electrodes 18a, 18b, 18c and 18d are formed n−−- type barrier regions adjacent to the major surface of the substrate. The first gate electrodes 16a, 16b, 16c and 16d are supplied with an input signal v$_{in}$ (±0.5 V) biased by a DC voltage V$_B$ (+8 V). Having the same area, the second gate electrodes or weighting electrodes 17a, 17b, 17c and 18d are supplied with the weighting voltages Vh1(+), Vh2(+), Vh3(+) and Vh4(+) (4 to 12 V) having such magnitudes that the capacitances of oxide films under the electrodes exhibit a desired weighting coefficient ratio. The pulse φ$_S$ is applied to each of the source regions 15a, 15b, 15c and 15d, while the pulse φ$_G$ is applied to each of the third gate electrodes 18a, 18b, 18c and 18d, so that, while charges are being injected under the second gate electrodes from the source regions, the barriers under the third gate electrodes are raised to prohibit the injection of charges under transfer electrodes 20b, 20c, 20d and 20e of CCD 1 from the charge injectors and, while the injection of charges under the second gate electrodes from the source regions is prohibited, the barriers under the third gate electrodes are lowered to allow the injection of signal charges into CCD 1 from the charge injectors. The quantity of charge injected under the second gate electrode or weighting electrode and transferred to the CCD 1 is in proportion to the product of the capacitance of the oxide film under the weighting electrode and the difference between the surface potentials under the first gate electrode and the third gate electrode. The capacitance of the oxide film under the weighting electrode is proportional to the magnitude of its corresponding weighting voltage. Thus, a signal charge packet injected into the CCD from each signal charge injector consists of an AC signal charge component corresponding to the input signal $v_{in}$ and multiplied by a weighting coefficient and a DC charge component proportional to the product of the weighting coefficient and the difference between the surface potential under the first gate electrode provided by the bias voltage $V_B$ and the surface potential under the third gate electrode provided by a high level voltage 9 V of the pulse $\phi_G$. The quantity of DC charge injected into CCD by a signal charge injector with a smaller weighting coefficient would be smaller.

The signal charge drain means 4a, 4b, 4c and 4d are comprised of fourth gate electrodes 29a, 29b, 29c and 29d, fifth gate electrodes 30a, 30b, 30c and 30d, sixth gate electrodes 31a, 31b, 31c and 31d, and drain regions 32a, 32b, 32c and 32d, respectively. The fourth gate electrodes 29a, 29b, 29c and 29d, like the first gate electrodes 16a, 16d, 16c and 16d, are supplied with the input signal $v_{in}$ biased by the DC voltage $V_B$. The fifth gate electrodes 30a, 30b, 30c and 30d, which have the same area as that of the second gate electrodes 17a, 17b, 17c and 17d, are supplied with the weighting voltages Vh1(−), Vh2(−), Vh3(−) and Vh4(−), respectively. The sixth gate electrodes 31a, 31b, 31c and 31d, like the third gate electrodes 18a, 18b, 18c and 18d, are supplied with the pulse $\phi_G$, while the drain regions 32a, 32b, 32c and 32d are supplied with a DC voltage $V_{DD}$ (+16 V). At portions of the semiconductor substrate under the fourth gate electrodes 29a, 29b, 29c and 29d and the sixth gate electrodes 31a, 31b, 31c and 31d are formed $n^{--}$-type barrier regions adjacent to the major surface of the substrate.

CCD 1 has successive transfer electrodes 20a, 21a, 22a, 19b, 20b, 21b, 22b, 19c, 20c, 21c, 22c, 19d, 20d, 21d, 22d, 19e, 20e and 21e. At portions of the semi-conductor substrate under the narrow transfer electrodes 21a, 21b, 21c, 21d, 21e, 19b, 19c, 19d and 19e are formed $n^{--}$-type barrier regions adjacent to the major surface of the substrate. The fourth electrodes 29a, 29b, 29c and 29d of the charge drain means 4a, 4b, 4c and 4d are disposed adjacent to the transfer electrodes 20a and 22a, 20b and 22b, 20c and 22c, and 20d and 22d, respectively. The third gate electrodes 18a, 18b, 18c and 18d of the signal charge injector means 3a, 3b, 3c and 3d are arranged adjacent to the transfer electrodes 20b, 20c, 20d and 20e respectively. The transfer electrodes 20a, 19b, 20b, 19c, 20c, 19d, 20d, 19e and 20e are supplied with a transfer pulse $\phi_1$ (0 to 16 V), while the transfer electrodes 21a, 22a, 21b, 22b, 21c, 22c, 21d, 22d and 21e are supplied with a DC voltage V (30 $\neq$V). This, in CCD 1, the charge transfer is performed in one direction—from left to right in the figure.

The output means 5 is comprised of a floating diffusion region 24 formed in the semiconductor substrate adjacent to the last transfer electrode 21e of CCD 1, a reset gate electrode 25 adjacent to the region 24 to which a reset pulse $\phi_R$ is applied, drain region 26 adjacent to the electrode 25 and connected to the DC power source $V_{DD}$, and a source follower amplifier 29 comprised of a MOS FET 27 with its gate connected to the floating diffusion region 24 and its drain connected to the DC power source $V_{DD}$, and a resistor 28 connected to the source of FET 27. In this output means, the output signal charge is detected by the source follower amplifier 29, and then the charge is removed in synchronism with the reset pulse $\phi_R$ by means of the reset gate electrode 25 and the drain region 26.

Figure 5A:
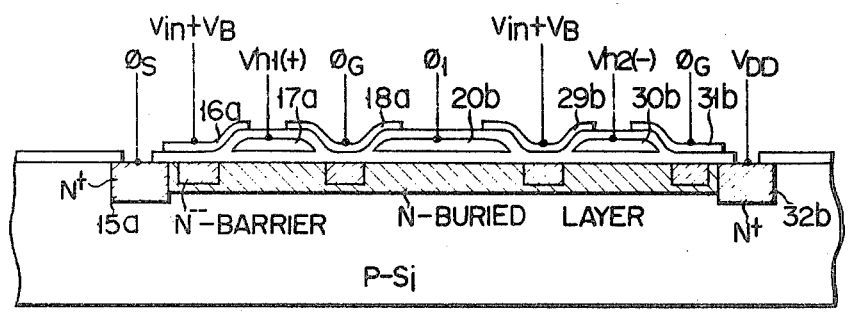
FIG. 5A is a sectional view as taken along line A—A' of FIG. 3.

Referring now to FIGS. 4 5A to 5F and 6A to 6F, there will be described the charge injecting and draining operations of the transversal filter constructed as described above. FIG. 4 is a timing diagram showing the pulses $\phi_1$, $\phi_S$ and $\phi_G$ used in the arrangement of FIG. 3, and FIGS. 5A and 6A are schematic sectional views of the transversal filter as taken along lines A—A' and B—B' of FIG. 3, respectively. FIGS. 5B to 5F show surface potential profiles and charges under the electrodes of FIG. 5A at the times as shown in FIG. 4, while FIGS., 6B to 6F show surface potential profiles and charges under the electrode of FIG. 6A at the times of FIG. 4.

Figure 5B:
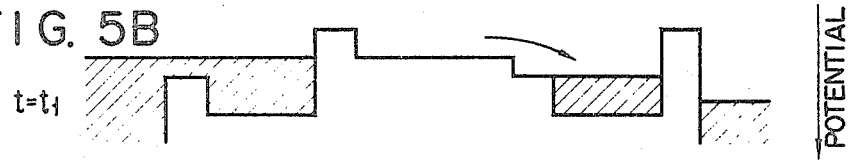
FIGS. 5B to 5F show potential profiles along the sectional view of FIG. 5A at times as shown in the timing diagram of FIG. 4.
Figure 5C:
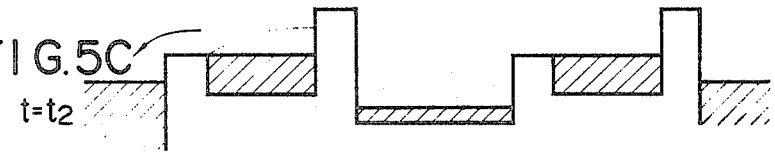
Figure 6A:
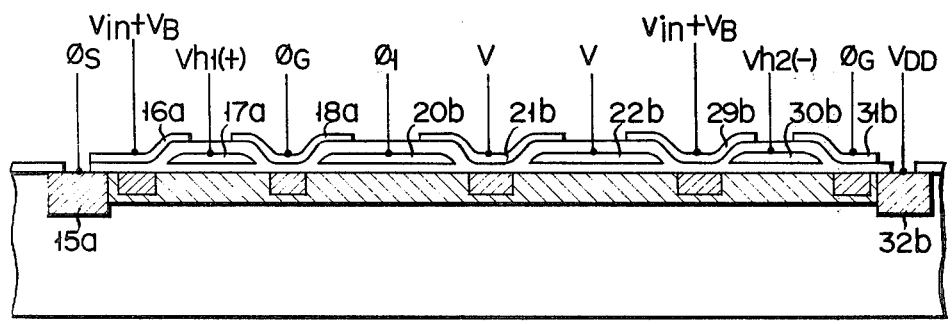
FIG. 6A is a sectional view as taken along line B—B' of FIG. 3.
Figure 6B:
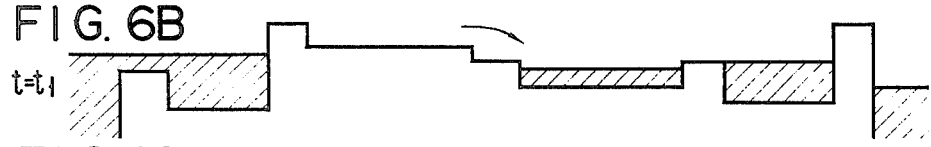
FIGS. 6B to 6F show potential profiles along the section shown in FIG. 6A at the times shown in FIG. 4.
Figure 6C:
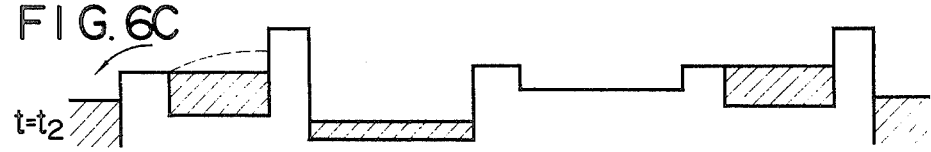

At time t1 when the pulse $\phi_S$ is at the low level (10 V), charge is injected under the weighting electrode 17a from the source region 15a over the barrier under the first gate electrode 16a, as shown in FIGS. 5B and 6B. At this time, the pulse $\phi_G$ is also at the low level (0 V), so that the barrier under the third gate electrode 18a is too high for the charge from the source region 15a to pass over it. Since the pulse $\phi_1$ is at the low level (0 V), the charge under the transfer electrode 20b is transferred under the transfer electrode 22b as shown in FIG. 6B, and further transferred below the weighting electrode 30b across the barrier under the transfer electrode 29b as shown in FIG. 5B. At time t2 both pulses $\phi_1$ and $\phi_S$ are at the high level (+16 V). Accordingly, as shown in FIGS. 5C and 6C, a portion of charge under the electrode 18a which has a potential lower than the surface potential under the first gate electrode 16a returns to the source region 15a. Since the pulse $\phi_1$ is at the high level (+16 V), the surface potential under the transfer electrode 20b is raised, so that the charge stored under the preceding transfer electrode 22a is transferred under the transfer electrode 20b.

Figure 5D:
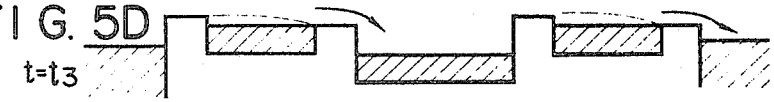
Figure 5E:
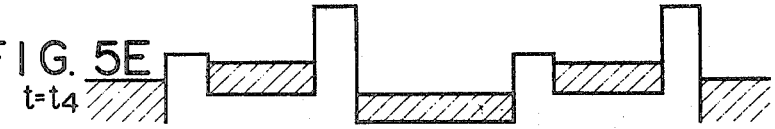
Figure 6D:
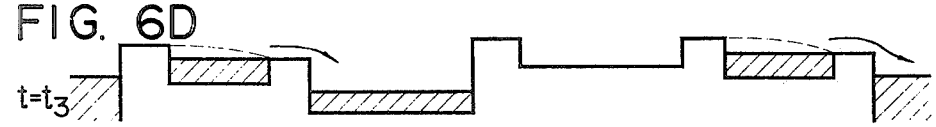
Figure 6E:
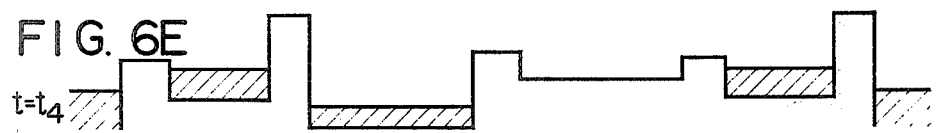

At time t3 the pulse $\phi_G$ is at the high level (+9 V), so that the surface potential under the third gate electrode 18a is raised, and part of the charge under the second gate electrode 17a which is at a potential lower than the surface potential under the third gate electrode 18a is transferred under the transfer electrode 20b, as shown in FIGS. 5D and 6D. The transferred charge consists of an AC signal component $\bar{q}s(1)$ and a DC component qo(1) weighted by the weighting voltage Vh1(+). At the same time, the barrier under the sixth gate electrode 31b is lowered to allow part of the charge under the weighting electrode 30b to flow into the drain region 32b. The flow charge consists of an AC signal component q's(2) and a DC component q'O(2) weighted by the weighting voltage Vh2(−). If the magnitudes of the weighting voltages Vh1(+) and Vh2(−) are equal, then we obtain $\bar{q}s(1) = q's(2)$ and qo(1) = q'o(2).

At time t4 the pulse $\phi_G$ is at the low level, so that the barriers under the electrodes 18a and 31b are raised to prohibit the injection and drain of signal charge.

Figure 5F:
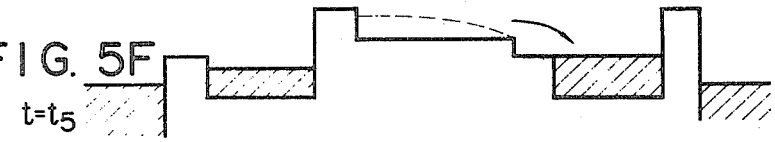
Figure 6F:
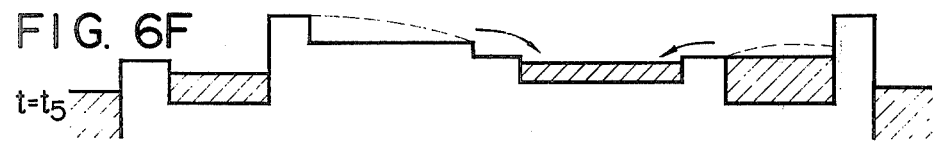

At time t5 the pulse $\phi_G$ is at the low level. As shown in FIGS. 5F and 6F, therefore, the charge under the transfer electrode 20b is transferred under the weighting electrode 30b across the barrier under the electrode 29b and under the transfer electrode 22b. Part of the charge under the electrode 30b which is at a potential lower than the surface potential under the electrode 29b, as shown in FIG. 6F, is transferred under the transfer electrode 22b. Thus, the sequence of operations is completed.

In the above-mentioned arrangement, if the weighting voltage VH1(+) is set at about 4 V, the surface potential under the weighting electrode 17a becomes substantially equal to the surface potential under the electrode 16a, so that the signal charge injector 3a is cut-off. Likewise, if the voltage Vh2(−) is set at about 4 V, then the signal charge drain 4b is cut-off.

FIG. 7 shows an example of the transversal filter, according to the arrangement of FIG. 3, whose weighting coefficients are fixed. That is, in this example, the signal charge injectors 3a and 3c and the signal charge drains 4b and 4d are omitted, and the DC voltage VG2 is applied to the weighting electrodes 30a, 17b, 30c and 17d. The weighting coefficients are determined by the areas of the weighting electrodes. In this example, the weighting electrodes 30a and 17b and the weighting electrodes 30c and 17d have an area ratio of 1.5 to 2.0, so that there may be formed an input-weighted transversal filter with weighting coefficients h1, h2, h3 and h4 set at −1.5, +1.5, −2.0 and +2.0, respectively.

Figure 8:
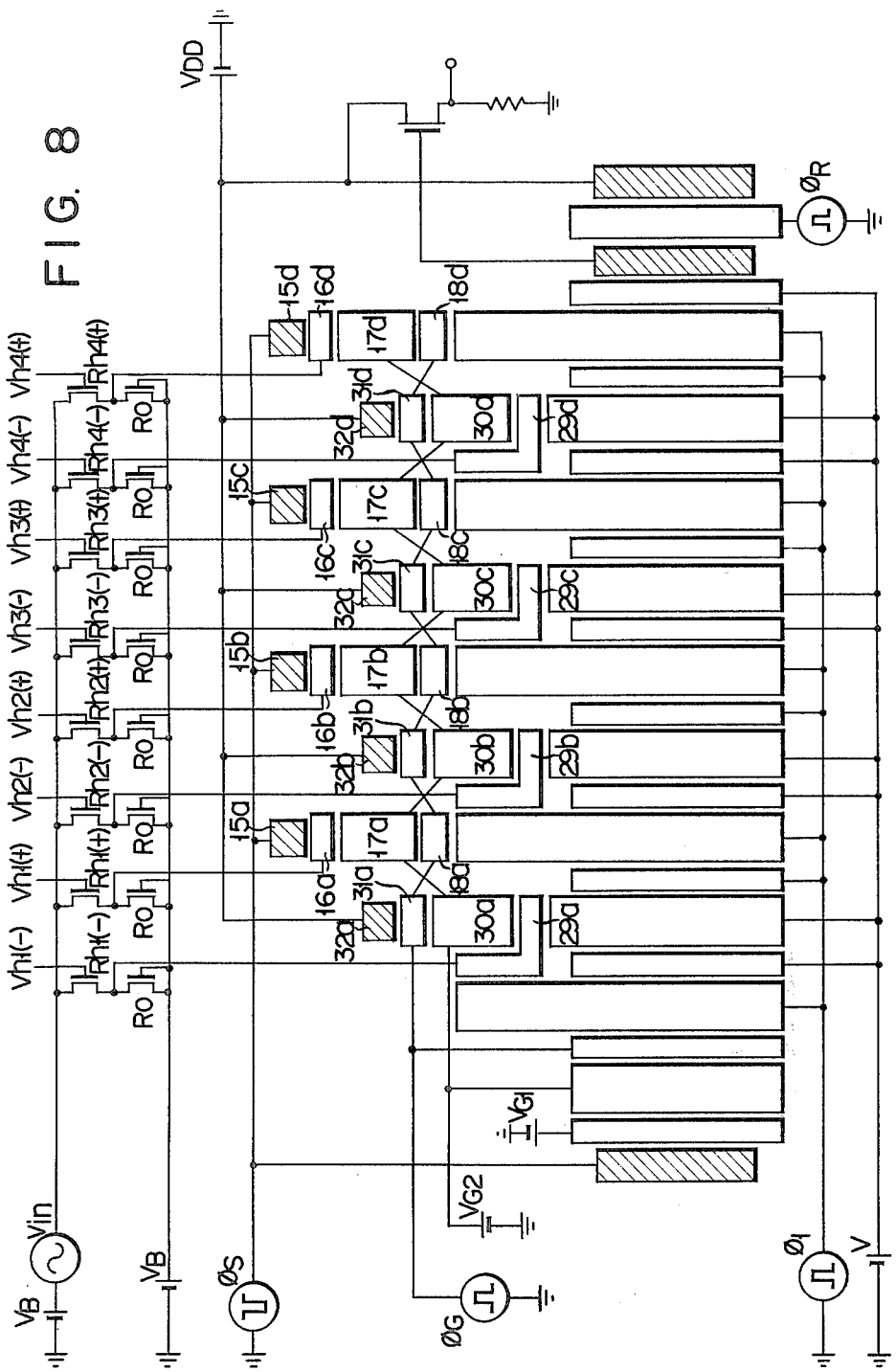

FIG. 8 shows another embodiment of this invention, which differs from the embodiment of FIG. 3 in that the input signal $v_{in}$ is amplitude-controlled by dividing ratios determined by resistance values of variable resistance elements Rh1(−), Rh1(+), Rh2(−), Rh2(+), Rh3(−), Rh3(+), Rh4(−) and Rh4(+) formed of MOS FET's having gate electrodes supplied respectively with the weighting voltages Vh1(−), Vh1(+), Vh2(−), Vh2(+), Vh3(−), Vh3(+), Vh4(−), and Vh4(+), and fixed resistance elements Ro formed of MOS FET's with fixed gate-to-source voltage, and then applied to the first gate electrodes 16a, 16b, 16c and 16d and the fourth gate electrodes 29a, 29b, 29c and 29d together with the bias voltage $V_B$. The second gate electrodes 17a, 17b, 17c and 17d and the first gate electrodes 30a, 30b, 30c and 30d are supplied with the DC voltage VG2.

If the aforesaid MOS FET's are so designed as to have a threshold voltage Vth of −6 V, the MOS FET's for the variable resistors are cut-off by a weighting voltage of 2 V. That is, the resistance value between the source and drain electrodes becomes infinite. Accordingly, if the voltage Vh1(−) is 2 V, for example, the electrode 29a is supplied only with the bias voltage $V_B$ (+8 V), and thus the first stage of CCD 1 is drained of a predetermined quantity of DC charge through the electrode 29a. That is, the signal charge drain is cut-off in the AC sense. In this state, if the voltage Vh1(+), is 2 V, the electrode 16a is supplied only with the bias voltage $V_B$, and thus a DC charge equivalent to the DC charge drained through the electrode 29a is injected into the fist stage. Where Vh1(−)=Vh1(+) (≠2 V), the drained AC and DC components are equivalent to the injected AC and DC components, respectively. Where Vh1(−)≠Vh1(+), on the other hand, the signal $v_{in}$ is positive- or negative-weighted.

That is, if the quantity of drained AC component is larger than that of injected AC component the input signal is negative-weighted, while, if the quantity of drained AC component is smaller than that of injected AC component the input signal is positive-weighted.

In the embodiment of FIG. 8, the mechanism for the charge injection and drain are the same as that of the embodiment of FIG. 3. In short, variable capacitance is used for the signal-weighting in the embodiment of FIG. 3, whereas variable resistance is employed for the same purpose in the embodiment of FIG. 8.

Figure 9:
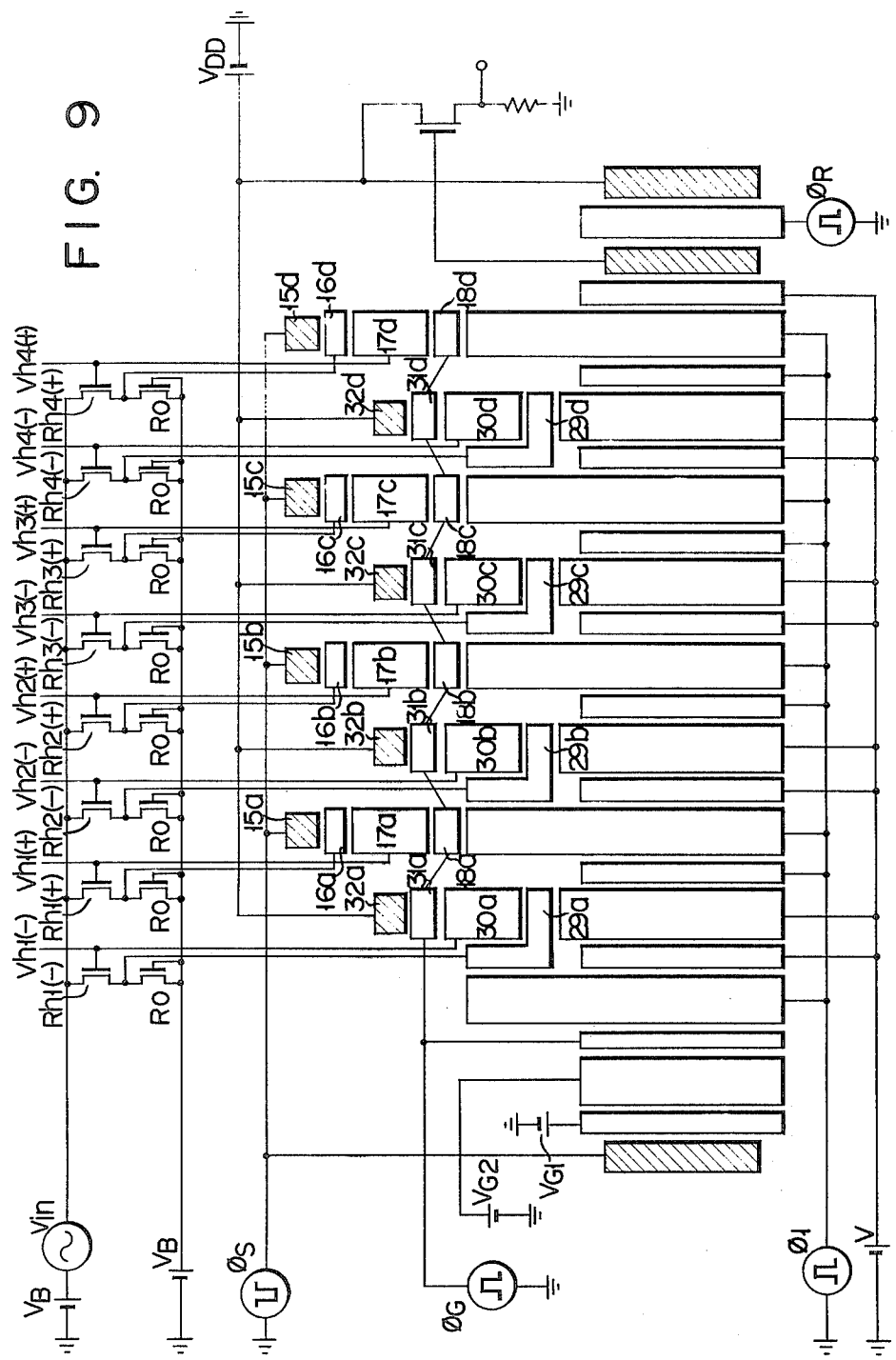
FIG. 9 shows a transversal filter which combines the arrangements of FIGS. 3 and 8.

FIG. 9 shows a transversal filter combining the arrangements of FIGS. 3 and 8. In this example, like the embodiment of FIG. 3, the weighting voltages Vh1(−), Vh1(+), Vh2(−), Vh2(+), Vh3(−), Vh3(+), Vh4(−) and Vh4(+) applied to the variable resistance elements Rh1(−), Rh1(+), RH2(−), Rh2(+), Rh3(−), Rh3(+), Rh4(−) and Rh4(+) are applied to the weighting electrodes 30a, 17a, 30b, 17b, 30c, 17c, 30d and 17d, respectively. Thus, the signal is doubly weighted by the variable resistance and the variable capacitance.

Figure 10:
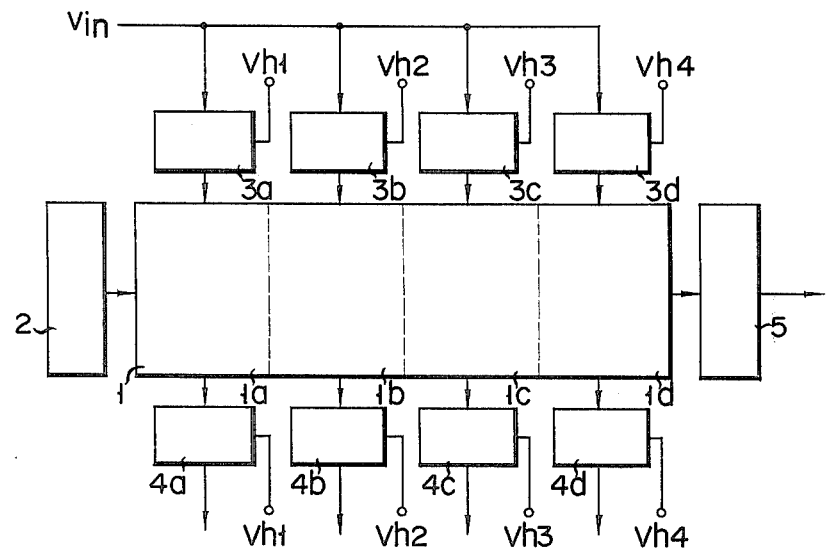
FIG. 10 shows a programmable input-weighted transversal filter according to another embodiment of the invention.

FIG. 10 is a block diagram of a transversal filter according to another embodiment of this invention. In this embodiment, charge injector means 3a to 3d inject their corresponding CCD stages 1a to 1d with signal charge packets containing AC and DC charge components in response to weighting voltages Vh1, Vh2, Vh3 and Vh4, and charge drain means 4a to 4d drains part of the charge corresponding only to the DC charge component from their corresponding stages 1a to 1d in response to the weighting voltages Vh1, Vh2, Vh3 and Vh4.

Figure 11:
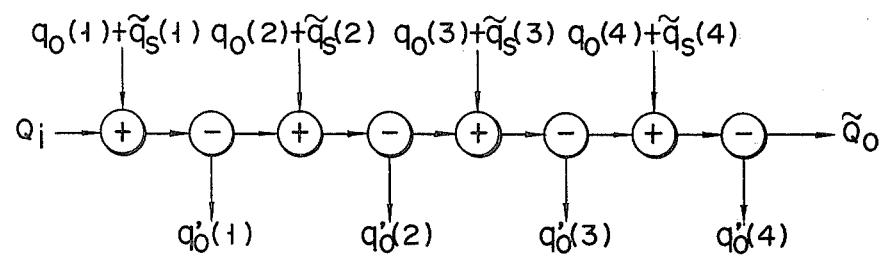
FIG. 11 is a diagram illustrating the operation principle of the transversal filter of FIG. 10.

Namely, in the transversal filter of FIG. 10, as shown in FIG. 11, a DC charge Qi is injected into CCD 1 by the DC charge injector means 2, weighted signal charges qo(1)+qs(1), qo(2)+qs(2), qo(3)+qs(3) and qo(4)+q̄s(4) are injected into stages 1a to 1d by signal charge injector means 3a to 3d, respectively, and DC charges q'o(1), q'o(2), q'o(3) and q'o(4) are drained from the stages 1a to 1d by charge drain means 4a to 4d, respectively. An output charge Qo taken out from the output means 5 is given by $$Qo = Qi + \sum_{k=1}^{4} [\{qo(k) + \bar{qs}(k)\} - q'o(k)].$$

That is, if an injected DC component qo(k) is equivalent to a drained DC component q'o(k) at the kth stage, we obtain $$Qo = Qi + \sum_{k=1}^{4} qs(k),$$

so that the output charge Qo equals the DC charge Qi injected into CCD 1 by the DC charge injector means 2 plus an AC charge. The widest dynamic range may be provided for the AC signals appearing at the output when the quantity of the DC charge Qi is approximately half the maximum quantity of charge that can be stored in each stage of CCD 1.

Further, in the transversal filter of FIG. 10, selection between positive and negative weighting depends on the polarity of an input signal applied to the signal charge injector means.

Figure 12:
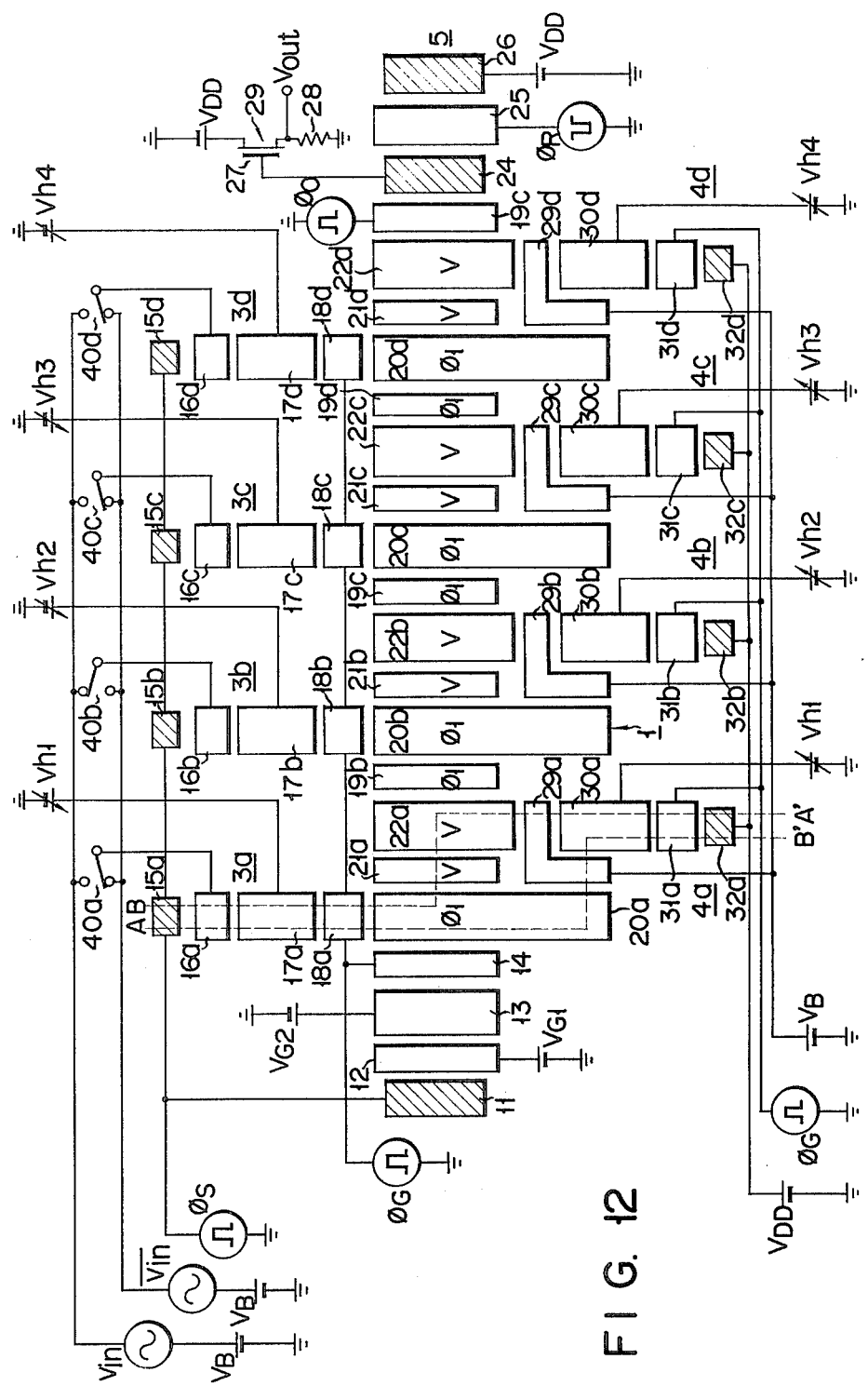
FIG. 12 is a plan view of a practical arrangement of the transversal filter of FIG. 10.

FIG. 12 is a plan view showing a practical arrangement of the programmable transversal filter of FIG. 10. The same parts at those in FIG. 3 are designated by like reference numerals, descriptions thereof being omitted. The weighting electrodes 17a and 18d of the signal charge injector means 3a to 3d and the weighting electrodes 30a to 30d of the charge drain means 4a to 4d all have the same area, and the weighting electrodes of each corresponding signal charge injector means and charge drain means are supplied with the same weighting voltage.

The first gate electrodes 16a to 16d of the signal charge injector means 3a to 3d are selectively supplied with $v_{in}+V_B$ or $\overline{v_{in}}+V_B$ via changeover switches 40a to 40d, respectively. Signals $v_{in}$ and $\overline{v_{in}}$ are opposite to each other in polarity. The fourth gate electrodes 29a to 29d of the charge drain means 4a to 4d are supplied with the DC voltage $V_B$.

Within a certain range of weighting voltage Vhk, a capacitance formed under each weighting electrode satisfies $$C[VhK] = K \cdot Vhk$$

where K is a constant. Accordingly, charge Qsig(+) or Qsig(−) stored under each of the weighting electrodes 17a and 18d is given as follows:

$$Q\text{sig}(+) = C[Vhk] \cdot \{V_C - (v_{in} + V_B)\}$$
$$= K \cdot Vhk(V_C - V_B) - K \cdot Vhk \cdot v_{in},$$
$$Q\text{sig}(-) = C[Vhk] \cdot \{V_C - (\overline{v_{in}} + V_B)\}$$
$$= K \cdot Vhk(V_C - V_B) + K \cdot Vhk \cdot v_{in}$$

where $V_C$ is a high-level voltage of the pulse $\phi_G$ applied to the third gate electrodes 18a to 18d.

The fourth gate electrodes 29a to 29d of the charge drain means 4a to 4d adjacent to CCD 1 are supplied with the DC voltage $V_B$, while the sixth gate electrodes 31a to 31d are supplied with the pulse $\phi_G$. Accordingly, a charge $Q_{OUT}$ stored under each of the weighting electrodes 30a to 30d and drained thereafter may be given by $$Q_{OUT} = C[Vhk](V_C - V_B) = K \cdot Vhk(V_C - V_B).$$

This is equal to the DC charge component of the input charge Qsig(+) or Qsig(−). Thus, a charge transferred under the transfer electrodes to reach the output means 5 equals the sum total of the DC charge Qi injected into the first stage of CCD 1 and the AC signal charge $-K \cdot Vhk \cdot v_{in}$ or $K \cdot Vhk \cdot v_{in}$ weighted by the weighting voltage Vhk and injected into the stages. The mechanisms of charge injection and drain as taken along line A—A' and B—B' of FIG. 12 are substantially the same as those of FIG. 3 described with reference to FIGS. 4, 5 and 6.

Figure 13:
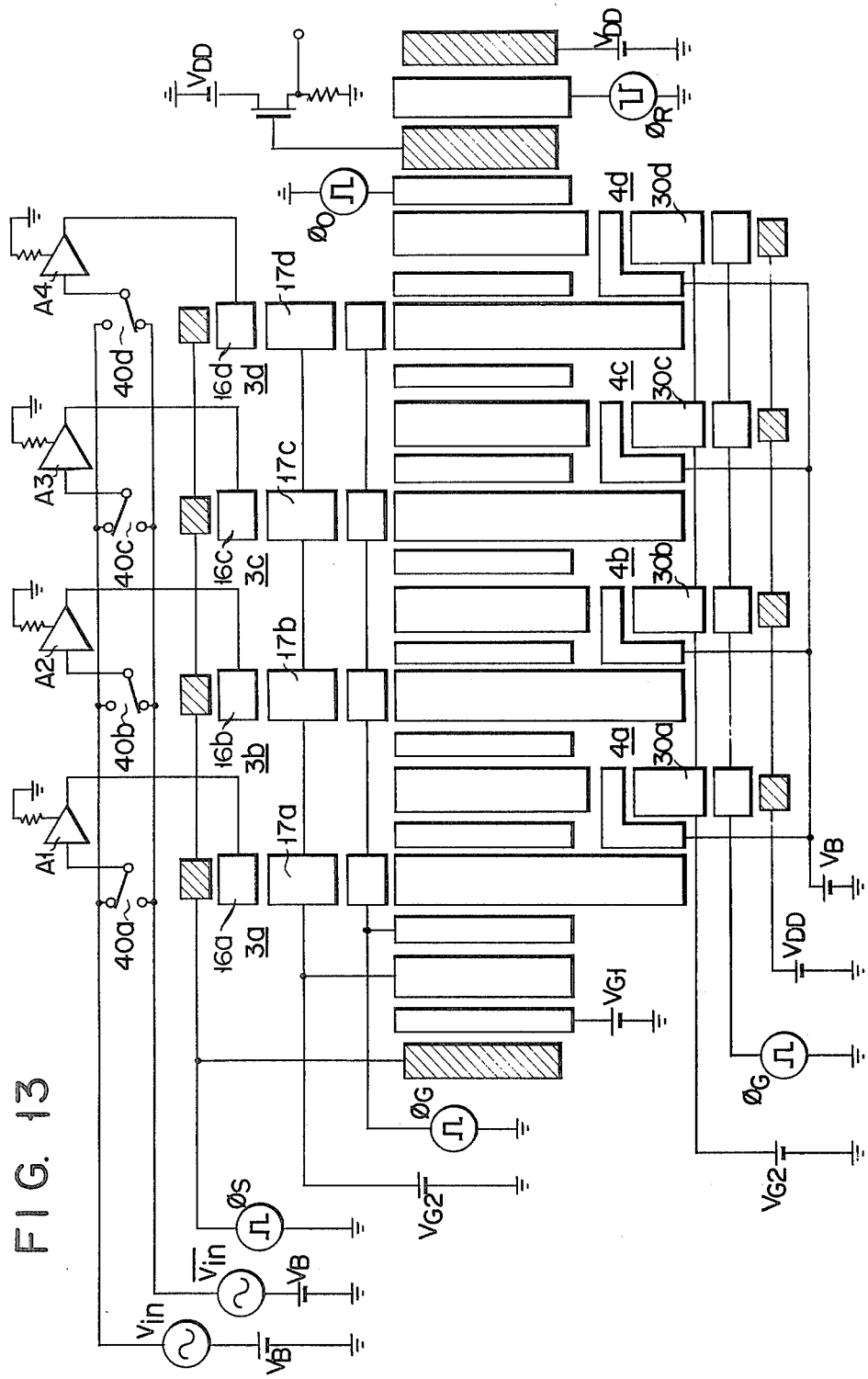

FIG. 13 shows a modification of the embodiment of FIG. 12, in which the weighting electrodes 17a to 17d and 30a to 30d are supplied with the DC voltage $V_{G2}$, and the first gate electrodes 16a to 16d of the signal charge injector means 3a to 3d are supplied with a signal $K \cdot Vhk \cdot v_{in} + V_B$ or $K \cdot Vhk \cdot \overline{v_{in}} + V_B$ in which input signal $v_{in}$ is amplitude-controlled by variable impedance circuits A1 to A4 responsive to weighting voltages Vhk.

FIG. 14 shows a fixed transversal filter in which the weighting coefficients are determined according to the areas of the weighting electrodes. The weighting electrodes of each corresponding signal charge injector means and charge drain means have the same area, and are supplied with the DC voltage $V_{G2}$. Since the capacitance under each weighting electrode is in proportion to the area of the weighting electrode, the DC and AC components of the injected signal charge are also in proportion to the area of the weighting electrode, and the drained DC component is proportional to the area of the weighting electrode of the charge drain means.

According to this invention, as described above, there may be provided an input-weighted charge transfer transversal filter with high packing density and improved signal detecting capability, capable of easy positive and negative input signal weighting.

It is to be understood that this invention is not limited to the above-mentioned embodiments. The charge transfer device may be a 2-, 3- or 4-phase driven CCD or BBD, and a diode cut-off injector and a floating gate amplifier may be used for the charge injector means and output means, respectively. Instead of using the buried channel, moreover, a surface channel may be used for the charge transfer. The conductivity type of the semiconductor may be reversed by inverting the polarity of the voltage sources used.

What we claim is:

1. A charge transfer transversal filter comprising:
   a charge transfer device including a plurality of stages for transferring charges from the first stage to the final stage;
   DC charge injector means for injecting the first stage of said charge transfer device with a predetermined quantity of DC charge;
   a plurality of signal charge injector means connected to receive an analog input signal, and arranged to produce a weighted charge containing a weighted AC component and a weighted DC component by weighting said analog input signal in accordance with a weighting coefficient, and to inject said weighted charge into a corresponding stage of said charge transfer device;
   a plurality of charge drain means coupled to the stages of said charge transfer device for draining at least DC charge from corresponding stage; and
   output charge sensing means coupled to the final stage of said charge transfer device.

2. A charge transfer transversal filter according to claim 1, wherein said quantity of DC charge injected into said charge transfer device by said DC charge injector means is approximately half the maximum quantity of charge that can be stored in each stage of said charge transfer device.

3. A charge transfer transversal filter according to claim 1, wherein said plurality of charge drain means are connected to receive the analog input signal and arranged to drain the corresponding stage of a signal charge weighted in accordance with a weighting coefficient and containing a weighted AC component and a weighted DC component.

4. A charge transfer transversal filter according to claim 1, wherein said plurality of signal charge injector means, as well as said plurality of charge drain means, are disposed correspondingly to the stage of said charge transfer device, each said charge drain means being so arranged as to drain substantially the same quantity of weighted DC component as that of weighted DC component injected into its corresponding stage by its corresponding signal charge injector means.

5. A charge transfer transversal filter according to claim 1, wherein said DC charge injector means includes a source region and first, second and third gate electrodes successively disposed adjacent to said source region, said first and second gate electrodes being supplied with predetermined DC voltages and said source region and said third gate electrode being supplied respectively with first and second pulses, so that a DC charge is injected under said second electrode from said source region during a first period of time, and the charge under said second gate is injected into said charge transfer device during a second period of time succeeding said first period.

6. A charge transfer transversal filter according to claim 1, wherein each said signal charge injector means includes a source region said first, second and third gate electrodes successively disposed adjacent to said source region, said first electrode being supplied with said analog input signal biased by a DC bias voltage, said second gate electrode being supplied with a DC voltage, and said source region and said third gate electrode being supplied respectively with first and second pulses, and each said charge drain means includes fourth, fifth and sixth gate electrodes and a drain region, said fourth gate electrode being supplied with said analog input signal biased by said DC bias voltage, said fifth gate electrode being supplied with a DC voltage, said sixth gate electrode being supplied with said second pulse applied to said third gate electrode, and said drain region being supplied with a predetermined DC voltage.

7. A charge transfer transversal filter according to claim 6, wherein said second gate electrode of said signal charge injector means and said fifth gate electrode of said charge drain means have the same area, and are respectively supplied with variable DC voltages.

8. A charge transfer transversal filter according to claim 6, wherein said second gate electrode of said signal charge injector means and said fifth gate electrode of said charge drain means have areas in proportion to weighting coefficients, and are supplied with DC voltages with the same magnitude.

9. A charge transfer transversal filter according to claim 6, wherein said second and fifth gate electrodes have the same area and are supplied with DC voltages with the same magnitude, and said first and fourth gate electrodes are supplied with an input signal biased by said DC bias voltage and amplitude-controlled.

10. A charge transfer transversal filter according to claim 6, wherein said second and fifth gate electrodes have the same area and are supplied with variable DC voltages, and said first and fourth gate electrodes are supplied with an input signal biased by said DC bias voltage and amplitude-controlled.

11. A charge transfer transversal filter according to claim 4, wherein each said charge injector means includes a source region and first, second and third gate electrodes successively disposed adjacent to said source region, said source region and said third gate electrode being supplied respectively with first and second pulses, said first gate electrode being supplied with an input signal biased by a DC bias voltage, and said second gate electrode being supplied with a DC voltage, and each said charge drain means includes fourth, fifth and sixth gate electrodes and a drain region, said fourth gate electrode being supplied with said DC bias voltage applied to said first gate electrode, said fifth gate electrode being supplied with said DC voltage applied to said second gate electrode, said sixth gate electrode being supplied with said second pulse applied to said third gate electrode, and said drain region being supplied with a predetermined DC voltage.

12. A charge transfer transversal filter according to claim 11 further comprising means for changing the polarity of said input signal applied to said first gate electrode.

13. A charge transfer transversal filter according to claim 11, wherein said second and fifth gate electrodes have the same area, and the second and fifth gate electrodes of each corresponding signal charge injector means and charge drain means are supplied with the same variable voltage.

14. A charge transfer transversal filter according to claim 11, wherein said second and fifth gate electrodes have the same area and are supplied with DC voltages with the same magnitude, and said first gate electrode is supplied with an amplitude-controlled input signal.

15. A charge transfer transversal filter according to claim 11, wherein the second and fifth gate electrodes of each corresponding signal charge injector means and charge drain means have the same area and are supplied with DC voltages with the same magnitude, and the second gate electrodes of said plurality of signal charge injector means have areas in proportion to weighting coefficients.

* * * * *